United States Patent
Vesterinen et al.

(10) Patent No.: US 12,206,367 B2
(45) Date of Patent: Jan. 21, 2025

(54) TRAVELING WAVE PARAMETRIC AMPLIFIER

(71) Applicant: Arctic Instruments Oy, Espoo (FI)

(72) Inventors: Visa Vesterinen, Espoo (FI); Slawomir Simbierowicz, Espoo (FI)

(73) Assignee: Arctic Instruments Oy, Espoo (FI)

( * ) Notice: Subject to any disclaimer, the term of this patent is extended or adjusted under 35 U.S.C. 154(b) by 217 days.

(21) Appl. No.: 17/919,351

(22) PCT Filed: Apr. 19, 2021

(86) PCT No.: PCT/FI2021/050283
§ 371 (c)(1),
(2) Date: Oct. 17, 2022

(87) PCT Pub. No.: WO2021/214383
PCT Pub. Date: Oct. 28, 2021

(65) Prior Publication Data
US 2023/0163737 A1  May 25, 2023

(30) Foreign Application Priority Data

Apr. 20, 2020  (FI) ..................................... 20205401

(51) Int. Cl.
*H03F 19/00* (2006.01)
*H01P 3/00* (2006.01)
*H03F 3/189* (2006.01)

(52) U.S. Cl.
CPC ............ *H03F 19/00* (2013.01); *H01P 3/003* (2013.01)

(58) Field of Classification Search
CPC . H03F 19/00; H03F 7/00; H01P 3/003; H10N 69/00; H10N 60/0912; H10N 60/12; H10N 60/805; G06N 10/40

USPC ..................................................... 330/4.5, 4.6
See application file for complete search history.

(56) References Cited

U.S. PATENT DOCUMENTS

| | | | |
|---|---|---|---|
| 10,873,302 B2 * | 12/2020 | Tan | ........................ H03F 7/02 |
| 2018/0034425 A1 | 2/2018 | Bell et al. | |
| 2019/0074801 A1 | 3/2019 | Tan | |

FOREIGN PATENT DOCUMENTS

| | | |
|---|---|---|
| JP | 2009225213 A | 10/2009 |
| JP | 2019530336 A | 10/2019 |
| WO | WO2019038518 A1 | 2/2019 |

OTHER PUBLICATIONS

Grimsmo et al: Squeezing and quantum state engineering with Josephson traveling wave amplifiers. Cornell University Library [online], Jul. 26, 2016, pp. 1-22.
Chen et al: Travelling Wave Mechanism and Novel Analysis of the Planar Archimedean Spiral Antenna in Free Space. Progress in Electromagnetics Research, vol. 145, 2014, pp. 287-298.
Desalvo et al: Self-focusing and self-defocusing by cascaded second-order effects in Ktp. Opt. Lett., 17, 1992, pp. 28-30.
(Continued)

*Primary Examiner* — Hieu P Nguyen
(74) *Attorney, Agent, or Firm* — Laine IP Oy (57) ABSTRACT

According to an example aspect of the present invention, there is provided a travelling wave parametric amplifier comprising a transmission line comprising therein a plurality of Josephson elements and a plurality of shunt capacitors, and wherein at least some of the shunt capacitors are dispersive capacitors comprising an open-ended, distributed transmission line.

13 Claims, 4 Drawing Sheets

(56) References Cited

OTHER PUBLICATIONS

Dixon et al: Capturing Complex Behaviour in Josephson Travelling Wave Parametric Amplifiers. Phys. Rev. Applied 14, 034058, Dec. 11, 2019, pp. 1-11.

Frattini et al: Optimizing the nonlinearity and dissipation of a SNAIL Parametric Amplifier for dynamic range. Cornell Univ., 2018-12-20, pp. 1-17.

Miano et al: Symmetric Traveling Wave Parametric Amplifier. IEEE Transactions on Applied Superconductivity, vol. 29, No. 5, Aug. 2019, pp. 1-6.

O'Brien et al: Resonantly phase-matched Josephson junction traveling wave parametric amplifier. Phys. Rev. Lett., 113, Jun. 9, 2014, pp. 1-8.

O'Brien: Nonlinear Light-Matter Interactions in Metamaterials. UC Berkeley, 2016, pp. 1-89.

Parameswaran et al: Observation of 99% pump depletion in single-pass second-harmonic generation in a periodically poled lithium niobate waveguide. Opt. Lett., 27, 2002, pp. 43-45.

Planat et al: A photonic crystal Josephson traveling wave parametric amplifier. Phys. Rev. X 10, 021021, Oct. 18, 2019, pp. 1-17.

Tan et al: Design of a Uniplanar Resonance Phase-Matched Josephson Travelling-Wave Parametric Amplifier. 10th UK, Europe, China Millimeter Waves and Terahertz Technology Workshop, IEEE Xplore Digital Library, Sep. 11, 2017, 4 Pages.

White et al: Traveling wave parametric amplifier with Josephson junctions using minimal resonator phase matching. Cornell Univ. Library, Mar. 15, 2015, pp. 1-15.

Yun et al: Basic RF Characteristics of Fishbone-Type Transmission Line Employing Comb-Type Ground Plane (FTLCGP) on PES Substrate for Usein Flexible Passive Circuits. ETRI Journal, vol. 37, No. 1, Feb. 2, 2015, pp. 128-137.

Zhang et al: Josephson Metamaterial with a widely tunable positive/negative Kerr constant. Cornell University Library, Jul. 21, 2017, pp. 1-5.

Zorin: Flux-driven Josephson traveling-wave parametric amplifier. Phys. Rev. Applied 12, 044051, Oct. 30, 2019, pp. 1-14.

Zorin: Josephson Traveling-Wave Parametric Amplifier with Three-Wave Mixing. Phys. Rev. Applied 6, 034006, Oct. 30, 2019, pp. 1-8.

\* cited by examiner

Providing a transmission line comprising therein plural Josephson elements and a plurality of shunt capacitors — 410 at least some of the shunt capacitors are dispersive capacitors comprising an open-ended, distributed transmission line — 420

FIGURE 4

TRAVELING WAVE PARAMETRIC AMPLIFIER

FIELD

The present invention relates to superconducting traveling wave parametric amplifiers, TWPAs.

BACKGROUND

Parametric amplifiers are in effect mixers, wherein a weaker input signal may be amplified by mixing it with stronger pump signal, producing a stronger output signal as a result. Parametric amplifiers rely on a nonlinear response of a physical system to generate amplification. Such amplifiers may comprise standing wave parametric amplifiers or traveling wave parametric amplifiers, wherein a traveling wave parametric amplifier uses a series of nonlinear elements distributed along a transmission line, such as a coplanar waveguide, for example. In case the nonlinear elements comprise Josephson junctions, the amplifier may be referred to as a Josephson traveling wave parametric amplifier, JTWPA. In a JTWPA, the Josephson junctions are maintained in superconducting condition and carry a supercurrent.

In use, a signal is added to the strong oscillator signal, resulting in a sum signal wherein an amplitude envelope exhibits variance at a frequency which is a difference between the signal and oscillator frequencies. Since in the waveguide transmission line, a phase velocity is dependent on amplitude, a phase of the summed signal at the end of the line will vary in accordance with a difference in the two frequencies. In effect, the nonlinear waveguide transmission line converts amplitude modulation into phase modulation. In case the non-linearity is strong enough, this will result in a gain at the signal frequency.

SUMMARY OF THE INVENTION

According to some aspects, there is provided the subject-matter of the independent claims. Some embodiments are defined in the dependent claims.

According to a first aspect of the present invention, there is provided a travelling wave parametric amplifier comprising a transmission line comprising therein a plurality of Josephson elements and a plurality of shunt capacitors, and wherein at least some of the shunt capacitors are dispersive capacitors comprising an open-ended, distributed transmission line.

According to a second aspect of the present invention, there is provided a method, comprising providing a transmission line comprising therein a plurality of Josephson elements and a plurality of shunt capacitors, and wherein at least some of the shunt capacitors are dispersive capacitors comprising an open-ended, distributed transmission line.

EMBODIMENTS

In accordance with solutions disclosed herein, a traveling wave parametric amplifier, TWPA, may be enabled to use higher critical current densities and higher plasma frequencies, which results in the benefit that a device footprint of the TWPA may be reduced. As the plasma frequency need not be as precisely defined as in prior solutions, Josephson junctions need not be manufactured to as high a precision as earlier. Yet still, in TWPAs manufactured according to principles disclosed herein, dispersion characteristics are highly reproducible. A high TWPA gain is obtained due to phase-matching of three-wave mixing by purposefully inefficient generation of the $2^{nd}$ harmonic of the pump tone. In addition, due to a lower dielectric loss in shunt capacitors, a higher gain and lower added noise in three- and four-wave mixing in TWPAs is obtained These benefits are obtained in TWPAs as will be described herein below. In brief, dispersion is introduced into the TWPA using shunt capacitive elements, such as shunt capacitive elements of TWPA unit cells. These dispersive shunt capacitors each comprise an open-ended, distributed transmission line. In comparison to the typical realization of the shunt capacitors as parallel plates separated by a dielectric layer, this reduces dielectric loss in the TWPA. In flux-tuneable TWPAs, generating the dispersion mainly with the shunt capacitors rather than with the plasma resonance of Josephson elements is desirable: this decouples the dispersion from the magnetic flux tuning. In some embodiments, the open-ended, distributed transmission line is arranged in the form of a spiral, which reduces a physical footprint of the TWPA when manufactured on a chip. Another option is a polygonal shape.

Overall, for example in quantum computation, signals may be attenuated for transmission even to a single-photon or a near-single-photon regime. Detecting such signals presents challenges owing to their low amplitude. Therefore, suitable amplifiers may be employed to increase the amplitudes of received signals prior to their provision to detector elements, where the information encoded into these received signals may be recovered. As another example, a single-photon regime communication may be employed in communicating encryption keys in a secure manner using quantum communication, such that eavesdropping without detection is made very difficult.

The present disclosure focuses on a superconductive realization of the TWPA, where the center trace of a transmission line is an array of Josephson junction based elements, known as Josephson elements, which constitute a non-linear inductance. The non-linearity enables a mixing process which provides power gain for a weak signal that propagates along the same direction as a strong radio frequency, rf, pump tone. The strength of the pump tone is measured with the ratio between the pump current amplitude Ip and a critical current Ic of the Josephson element. The nature of the non-linearity depends on the arrangement of Josephson junctions within the element. The simplest realization is the use of a single Josephson junction as the non-linear element: the associated Taylor expansion of the inductance is a constant plus a term proportional to $(Ip/Ic)^2$, that is, a Kerr non-linearity. While the Kerr term results in a desired four-wave mixing process, it also changes the wavevectors of the rf tones as a function of the pump power, an effect that may be compensated with dispersion engineering. The balancing of the wavevectors, also called phase matching, allows an exponential increase of the TWPA gain as a function of the device length. Due to the typically narrowband dispersive features embedded into the transmission line, the center frequency of gain is a fixed quantity in this example of the TWPA.

In general, TWPAs exist in two categories, namely operating based on three-wave mixing, 3WM, and devices operating based on four-wave mixing, 4WM. These mixing concepts are originally from the field of non-linear optics. In 3WM, the pump tone f_p is at twice the signal frequency f_s which is to be amplified, and the device tends to produce an unwanted second harmonic of the pump tone. The generation of this second harmonic may be referred to as second harmonic generation, SHG. In 4WM, the pump tone is in the same frequency band as the signal to be amplified, and an unwanted third harmonic of the pump tends to be generated. Regardless of whether a TWPA is based on 3WM or 4WM, the TWPA device comprises a transmission line which has a frequency-dependent wavenumber.

Figure 2A:
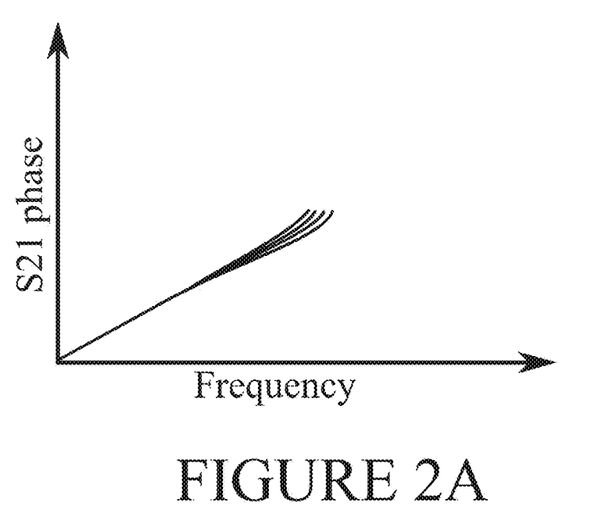
FIG. 2A illustrates simulated dispersion in a TWPA in accordance with at least some embodiments of the present invention.

Furthermore, in a device producing gain, an idler tone f_i is generated at a frequency of f_p−f_s (3WM) or 2f_p−f_s (4WM). Achieving a high gain requires phase matching, which means that the sum of the signal and idler wavenumbers (k_s+k_i) must be close to k_p (3WM) or 2k_p (4WM), with k_p the pump wavenumber. At the same time, the device must be dispersive in order to have phase mismatching of the unwanted harmonic generation of the pump. Dispersiveness in this context means that the wavenumber as a function of frequency deviates from a linear trend at frequencies above f_p. This behavior is illustrated in FIG. 2A. One way to control the dispersion is by adjusting the Josephson plasma frequency, $f_J$. The plasma frequency describes the effect of the tunnel junction's capacitance, which connects in parallel to non-linear Josephson inductance. In some embodiments, the TWPA consists of cascaded unit cells, each of which features a series impedance and a shunt impedance. In the limit of low frequency where the dispersion has no practical effect, the series impedance is the reactance of an inductor L and the shunt impedance is the reactance of a capacitor C. These quantities determine the unit cell LC eigenmode $f_0=(2\pi\sqrt{LC})^{-1}$. Together with the plasma frequency, the eigenmode sets a cut-off of the transmission line. At the cut-off, the real part of the wavenumber goes to zero, implying that wave propagation is not supported along the transmission line. Just below the cut-off the wavenumber diverges, showing a superlinear trend. One way of suppressing unwanted harmonic generation in TWPAs involves lowering of the plasma frequency towards the frequency of the pump harmonic generation. In more detail, $f_J$ may be comparable in magnitude to 2f_p in a 3WM TWPA, and 3f_p for a 4WN TWPA.

A TWPA design which relies on a low and/or precise value of the plasma frequency involves challenges, however. The plasma frequency is essentially a Josephson junction fabrication process parameter that is controlled by oxidation pressure and time. Changing the plasma frequency means that the junction critical current density is changed as well. This implies that designing for a low plasma frequency means that the physical size of the junctions will be large, which may in turn affect the overall footprint of the TWPA on the a chip.

If the TWPA has an adjustable magnetic flux degree of freedom which affects the Josephson element critical current, the plasma frequency will be adjustable as well. There are several reasons of why magnetic flux adjustability would be desired. Firstly, it may be desired for setting the characteristic impedance level of the TWPA transmission line to a correct value, for example to 50 ohm. Secondly, it may be desired for enabling three-wave mixing. If the dispersiveness of the TWPA depends primarily on the plasma frequency, then the dispersion could be coupled in a potentially undesired way to the impedance matching—three-wave mixing condition.

In prior literature, the theory of phase matching in 3WM Josephson TWPAs has been addressed only a few times. In the literature, second harmonic generation, SHG, is often either not discussed in sufficient detail or the device design attempts to block it altogether by stopband engineering. The phase mismatching of the SHG is quantified with the parameter $\Delta k_{SHG}=_{2p}-2k_p\neq 0$. However, the phase mismatching of the SHG via the unit cell and plasma cut-off inevitably leaves some residual phase mismatch for the mixing process which gives gain. This residual mismatch is quantified with the parameter $\Delta k_{TWPA}=k_p-k_s-k_i\neq 0$. This may, in turn, limit the gain available from the 3WM TWPA. Furthermore, Josephson TWPAs in general have the drawback of dielectric loss in shunt capacitors of the transmission line. The shunt capacitors are typically implemented as parallel plate capacitors comprising a dielectric material that is lossy and non-linear at millikelvin temperatures, due to the presence of two-level fluctuators. The dielectric loss has a negative effect on the gain and noise temperature of the TWPA.

TWPAs in accordance with the present disclosure implement dispersion control. Instead of relying solely on the plasma frequency of the series inductive element of the TWPA unit cell, dispersion is introduced in the shunt capacitors of the transmission line as well. To be specific, dispersive capacitors comprising an open-ended, distributed transmission line are used to introduce dispersion into the transmission line. This produces several benefits. Firstly, this reduces dielectric loss in the TWPAs. Secondly, in TWPAs with the adjustable magnetic flux degree of freedom, this decouples the dispersion from the flux adjustments of the gain and of the characteristic impedance. The physical footprint on a chip of the open-ended distributed transmission line may be small if, for example, a doubly-wound spiral geometry is chosen for it. By open-ended, distributed transmission line it is meant a structure that lacks a galvanic connection to the TWPA ground and in which capacitance and inductance are distributed continuously throughout the material.

Concerning the dispersive capacitors, an open-ended stub of transmission line behaves as a lumped capacitor at low frequencies, but shows resonances at certain high frequencies, the first of which corresponds to the stub being a quarter of wavelength long. The first resonance frequency is selected in such a way that the capacitance value has only minimal frequency dependence at the signal, pump and idler frequencies. This paves the way for a good phase matching of the gain process. However, the effective value of the capacitance starts to increase at frequencies higher than f_p, which provides phase mismatching of the harmonic generation. To be specific, the harmonic generation means transferring energy from the pump signal to a frequency equal to 2f_p, corresponding to SHG in 3WM or to 3f_p, corresponding to 4WM TWPA. In a 4WM TWPA, the precise value of the phase mismatch is not important as long as the third harmonic generation efficiency remains low, as described in [5]. By contrast, in a 3WM TWPA there is an optimal value for the phase mismatching of the SHG.

In the field of non-linear optics of light, it has been discovered that cascaded multiwave mixing processes may occur. In the 3WM TWPA, a cascaded process occurs where second harmonic generation is followed by the transfer of the pump energy from the second harmonic, 2f_p, back to the pump frequency f_p. This cascaded process occurs whenever phase matching of second harmonic generation, SHG, is not perfect. When a dispersive capacitor is responsible for the frequency dependence of the TWPA wavenumber, that is, responsible for the dispersion, having a finite phase mismatch of the second harmonic generation, SHG, implies that there is some residual phase mismatch in the gain process as well. Examples of finite phase mismatch include $\Delta k_{SHG}$ being 15% and 20% of k_p. Examples of residual phase mismatch include $\Delta k_{TWPA}$ being 1.5% and 2% of k_p. It has been found, that there is an optimal combination of 1) the SHG wavenumber mismatch $\Delta k_{SHG}$, 2) the amplification wavenumber mismatch $\Delta k_{TWPA}$, and 3) the TWPA pump power. At this optimum, the pump tone receives phase kicks from inefficient SHG, in a way that exactly compensates for the phase mismatch between the pump, signal and idler accumulating in the gain process. Furthermore, using a set of dispersive capacitors to generate dispersion in the transmission line allows several adjustments for optimizing TWPA operation. Firstly, the pump frequency may be shifted and new values may be obtained for the wavenumber mismatches. Secondly, the pump power can be shifted, and/or thirdly, if the TWPA is at the magnetic flux bias point that nulls 4WM while retaining finite 3WM, some magnetic flux offset may be applied to obtain positive or negative phase shifts from weak 4WM. An operating point of the TWPA is in a three-dimensional space defined by these axes of adjustments. The magnetic flux may be offset from its tentative optimum value, which corresponds to zero Kerr, to obtain a positive or negative Kerr value which may improve the phase matching. A potential drawback of the non-zero Kerr is potential activation of generation of a third harmonic of the pump frequency.

Insight into the multiwave mixing processes can be gained by studying coupled mode equations, CMEs, of 3WM in the absence of 4WM and in the absence of losses. The CMEs describe the evolution of the wave amplitudes as a function of position x along the transmission line of the TWPA. The CMEs of the SHG in the absence of parametric amplification read $$\partial_x A_p = -i\kappa A_p^* A_{2p} e^{-i\Delta k_{SHG} x}$$

$$\partial_x A_{2p} = -i\kappa A_2^p e^{-i\Delta k_{SHG} x}$$

where A_p is the slowly varying dimensionless amplitude of the pump, A_2p the slowly varying dimensionless amplitude of the second harmonic of the pump, and κ is a 3WM non-linear coefficient in units of 1/m. In the limit of phase matched SHG ($\Delta k_{SHG}=0$)

$$|A_{2p}(x)/A_p(0)|^2 = [\tanh(\Gamma x)]^2,$$

which implies potential for a 100% unidirectional conversion of the pump into the second harmonic. Here, the TWPA pump strength equals $\Gamma = \kappa |A_p(0)|$. Conversely, in the limit of weak SHG efficiency the pump experiences a phase distortion $$\Delta \Phi^{NL} \approx \frac{\Delta k_{SHG} x}{2}\left\{1 - \sqrt{1+(2\Gamma/\Delta k_{SHG})^2}\right\}.$$

The CMEs of near-degenerate parametric amplification in the absence of the SHG and in the limit of small phase mismatch $\Delta k_{TWPA} \ll k_p$ read $$\partial_x A_p \approx 0$$

$$\partial_x A_s \approx -0.25 i\kappa A_i^* A_p e^{-i\Delta k_{TWPA} x}$$

$$\partial_x A_i \approx -0.25 i\kappa A_s^* A_p e^{-i\Delta k_{TWPA} x}$$

where A_s and A_i are the slowly varying dimensionless amplitudes of the signal and idler, respectively. Being near-degenerate means in this context that the signal and idler frequencies are almost identical. The pre-factor 0.25 arises from the frequency difference of 0.25 between the signal and the second harmonic of the pump. In the limit of phase matched parametric amplification ($\Delta k_{TWPA}=0$)

$$|A_s(x)/A_s(0)|^2 = 1 + [\sinh(0.25\Gamma x)]^2,$$

which describes the power gain experienced by the signal. Considering the SHG and the parametric amplification simultaneously, we observe the optimum that achieves phase matching of the parametric amplification via inefficient SHG:

$$\Delta \Phi^{NL}/x + \Delta k_{TWPA} = 0.$$

In the limit of weak SHG efficiency a condition for the optimal TWPA pump strength is obtained:

$$\Gamma^2 = \Delta k_{TWPA}^2 + \Delta k_{TWPA} \Delta k_{SHG}.$$

If the plasma frequency and the first resonance mode of the shunt capacitors coincide, the characteristic TWPA line impedance will be frequency independent at low frequencies, to the first order. This may be beneficial from an impedance matching point of view at the signal, pump and idler frequencies.

Concerning dielectric losses of the proposed dispersive capacitor, as the transmission line of the capacitor is, for example, a planar structure made from a superconducting thin film on a low-loss substrate such as high-resistivity silicon, most of the electric field energy will reside in the substrate. This is to be contrasted against parallel plate capacitors in which almost all of the field energy is in the lossy dielectric layer.

Benefits of using the dispersive capacitors include an ability to use high critical current densities and high plasma frequencies in the TWPA, which may help reduce the device footprint. Further, relaxed requirements of Josephson junction fabrication are obtained, because some error in the plasma frequency can be tolerated. A further benefit is high reproducibility of the dispersion in TWPA fabrication. Yet further, a high TWPA gain may be obtained, due to phase matching of 3WM parametric amplification by inefficient SHG. A higher gain and lower added noise in 3WM or 4WM TWPAs is possible due to the lower dielectric loss in the shunt capacitors.

Figure 1A:
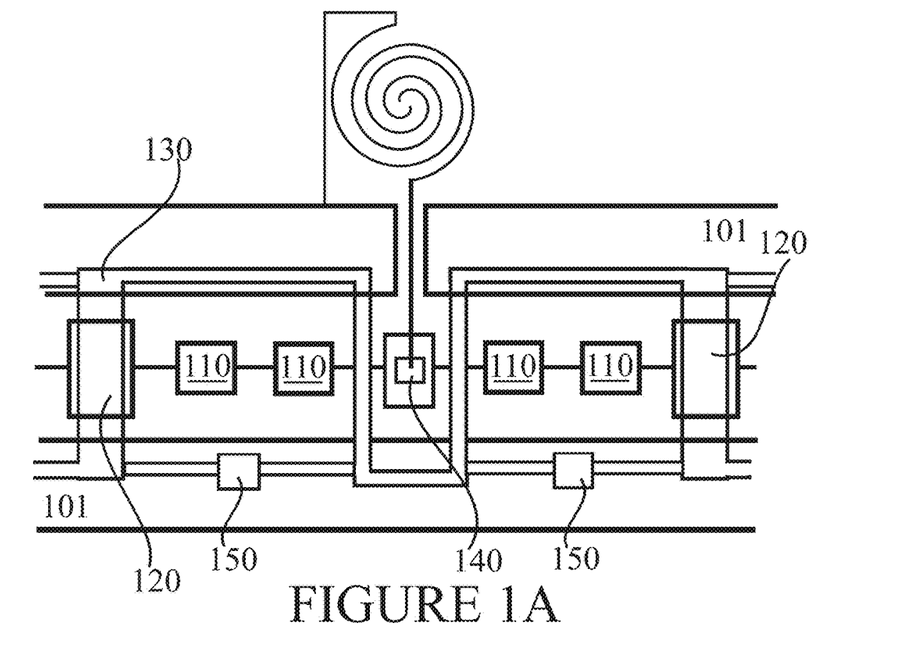
FIG. 1A illustrates a section of an example amplifier in accordance with at least some embodiments of the present invention.

FIG. 1A illustrates a section of an example amplifier in accordance with at least some embodiments of the present invention. The JTWPA of FIG. 1 comprises a coplanar waveguide transmission line, which comprises Josephson elements 110 and shunt capacitors 120. Each one of the Josephson elements comprises a loop, with at least one Josephson junction of a first size arranged in one side of the loop. At least one Josephson junction of a second size may further be arranged in another side of the loop. Examples of the loop include SQUIDs and SNAILs. As a specific example, the loops may comprise two large Josephson junctions on one side and one smaller Josephson junction on the other side, the smaller junction being 23% of the larger ones. This is an implementation of a SNAIL. In some embodiments, the Josephson elements 110 each comprise one and only one loop. The Josephson elements 110 are connected with each other with waveguides capable of conveying electromagnetic waves, as is known in the art. The overall coplanar waveguide transmission line, a section of which is illustrated in FIG. 1, has an input at the left, arranged to receive the signal to be amplified and a strong oscillator signal, which are mixed in the waveguide in the non-linear Josephson elements 110. In some embodiments, a unit comprises two consecutive Josephson elements 110. At an output is at the right, such that a phase-modulated amplified signal is eventually obtained as output at the end of the coplanar waveguide transmission line, a segment of which is illustrated in FIG. 1A. Two wiring layer elements 101, which are the ground planes of the coplanar waveguide, may each comprise a superconductor covered with an insulator, for example.

In general, a Josephson element, such as a single junction, a superconducting quantum interference device (SQUID), an asymmetric SQUID, or a more complex Josephson element such as a flux-qubit-like circuit, can be described using an effective potential energy:

$$U_{eff}(\varphi)/E_j = c_2\varphi^2 + c_3\varphi^3 + c_4\varphi^4 + $$

here $E_j$ is the Josephson energy, and $\varphi$ is the superconducting phase. The $c_2$ term relates to critical current and linear part of Josephson inductance, the $c_3$ term relates to 3-wave mixing and the $c_4$ term relates to 4-wave mixing, which is also known as the Kerr nonlinearity.

Normally single junctions and SQUIDs, including asymmetric SQUIDs, have $c_3=0$, whereby 3-wave mixing does not occur, and non-linearity is provided by the Kerr term. 3-wave mixing means the ability to pump at twice the input frequency, which is desirable. 3-wave mixing could be activated by injecting a dc current, but however, the Kerr term would remain non-zero.

Nonlinearity provided by the Kerr term is associated with the need for resonant phase matching, in practice the pump signal is given a small phase increment at regular intervals along the transmission line. This is due to the pump having a different phase velocity from the signal (at the frequency f_p) and the idler (at the frequency f_i). This phase mismatch increases with the pump power. Conservation of energy implies the existence of an idler frequency at the output, the frequency of which is located at the "mirror image" of the signal frequency with respect to the pump, f_i=2f_p−f_s. In detail, in the Kerr mode, phase mismatch and gain depend on the same parameter, the Kerr nonlinearity. The three frequencies are related by f_s+f_i=f_p in the case of 3-wave mixing. To minimize the amount of reflections, both ends of the TWPA further need to have good impedance match at each of the frequencies f_i, f_s and f_p.

The JTWPA of FIG. 1 has, in the waveguide, shunt capacitors 120, interspersed between the Josephson elements 110. Two Josephson elements 110 between every two shunt capacitors 120 is one example, to which the invention is not limited, indeed, in various embodiments there may be three or more Josephson elements 110 between every two shunt capacitors 120. The shunt capacitors 120 form the majority of the shunt capacitance of the transmission line. The JTWPA of FIG. 1 is a coplanar waveguide. The shunt capacitors 120 may be parallel-plate capacitors. Overall the JTWPA may comprise a large number of Josephson elements 110, such as 200, 800 or 1600 elements. For example, there may be more than fifteen Josephson elements 110.

The JTWPA of FIG. 1 is further furnished with an integrated flux bias line, FBL, 130. Flux bias line 130 is a two-port circuit that takes a serpentine path, ranging from one side of the coplanar waveguide to the other. In other words, the flux bias line meanders and proceeds alternatingly, repeatedly on either side of the coplanar waveguide transmission line. The flux bias line 130 forms an upper electrode of the shunt capacitors 120 in places where it crosses over to another side of the waveguide, as illustrated in FIG. 1A. The flux bias line 130 connects to the ground planes 101 of the transmission line through resistors 150, the value of which is much smaller than the reactive impedance of the shunt capacitors 120, at the relevant frequencies f_i, f_s and f_p. The purpose of the resistors is to provide an rf path to ground from the shunt capacitors 120. At the same time, the resistors and the flux bias line 130 enforce a similar electric potential of the ground planes at the frequencies f_i, f_s, and f_p.

As illustrated, flux bias line 130 extends on one side of the waveguide, parallel to the waveguide, before ranging over to another side of the waveguide at a place corresponding to one of the shunt capacitors 120, to again extend parallel to the waveguide on said another side of the waveguide. Where flux bias line 130 extends parallel to the waveguide, it may be connected to the ground planes 101 with the resistors. A dc current in the flux bias line 130 generates the magnetic field gradient for the Josephson elements 110. The flux bias line is configured to generate a magnetic flux threading each of the loops of the Josephson elements 110. The flux bias line may be connected to equalize electrical potentials of ground planes of the coplanar waveguide transmission line. This connection may be through resistors, for example.

In the TWPA of FIG. 1A, some of the shunt capacitors are dispersive capacitors 140. A dispersive capacitor 140 is provided with an open-ended, distributed transmission line which causes a dispersive effect in the transmission line of the TWPA, as described herein above. The open-ended, distributed transmission line is in the example of FIG. 1A arranged in a spiral arrangement to save space.

In some embodiments, the spiral arrangement is a double Archimedean spiral arrangement. In a double Archimedean spiral arrangement, a first conductor of the transmission line is arranged in a spiral and a second conductor of the transmission line is disposed in the same area in a shape that is a mirror image of the shape of the first conductor of the transmission line, the first and second conductors of the transmission lines not touching. The first conductor is connected with ground plane 101, and the other one with the central transmission line of the TWPA. Although illustrated as having only a few turns in FIG. 1A for the sake of clarity of the illustration, the spiral arrangement in practical implementations may have a much larger number of turns, such as several dozens, for example. In some embodiments with two concentric spirals, the spirals are not mirror images of each other, but concentrically arranged and winding in the same direction.

A low spiral eigenfrequency leads to large capacitor values, whereas a high spiral eigenfrequency may mean that dispersion is not sufficiently generated. One example is an approximately 40 GHz eigenmode of 4.6 turns of the spiral made of a thin superconducting film on silicon substrate. The film has a trace width of 1.9 micrometers and a gap of 1.1 micrometers. The diameter of the resulting geometry is approximately 75 micrometers.

In principle, all the shunt capacitors might be dispersive capacitors. On the other hand, in various embodiments only a part of the shunt capacitors are dispersive capacitors. For example, only every nth shunt capacitor is a dispersive capacitor, with n selected from the group {2, 3, 4, 5, 6, 7, 8, 9, 10, 11}. A benefit of not making every shunt capacitor dispersive is that cross-talk is avoided between the dispersive capacitors. 300 micrometers of separation for 75 micrometer spiral capacitors is a sufficient separation to avoid cross-talk, for example. In general, a separation equal to or greater than the diameter of a spirally wound capacitor may be sufficient to avoid cross-talk. The dispersive capacitors need not have exactly the same capacitance as the other shunt capacitors, although ideally the difference is small.

A second benefit of not making every shunt capacitor dispersive is the ability to do stopband engineering. Whenever the electrical separation between two spirals, as measured along the TWPA transmission line, equals an integer multiple of one half of the wavelength, a stopband will occur. It may be beneficial to place this kind of a stopband at or near the frequency of the higher harmonic generation of the pump.

Figure 1B:
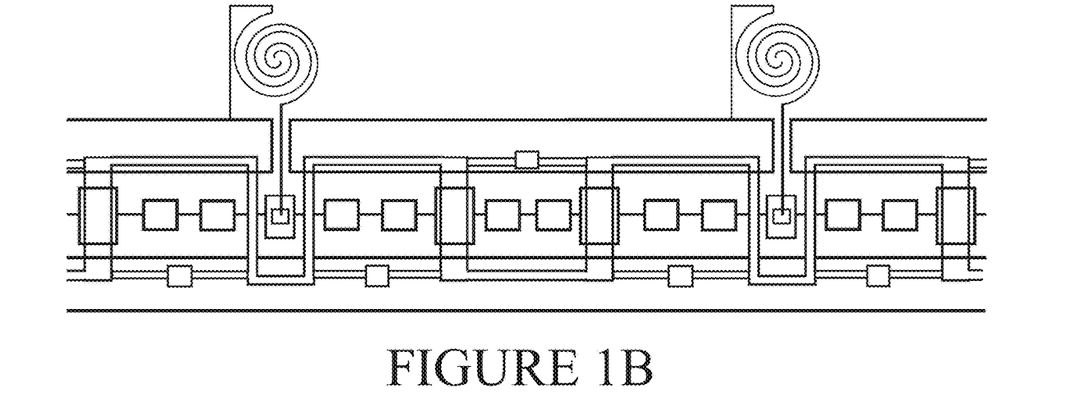
FIG. 1B illustrates a section of an example amplifier in accordance with at least some embodiments of the present invention.

FIG. 1B illustrates a section of an example amplifier in accordance with at least some embodiments of the present invention. The TWPA of FIG. 1B is the same one as in FIG. 1A, the difference between these figures being that a longer section of the transmission line is shown in FIG. 1B.

FIG. 2A illustrates simulated dispersion in a TWPA in accordance with at least some embodiments of the present invention. The figure illustrates the relationship between frequency of a signal propagating through the TWPA, on the horizontal axis, and a total phase change incurred by the signal while traversing the length of the TWPA on the vertical axis. The phase change of the vertical axis is known as the S21 (transmission) phase. Dispersion here means, that the wavenumber vs. frequency behaves almost linearly until frequency f_p, after which it behaves superlinearly, as illustrated.

Figure 2B:
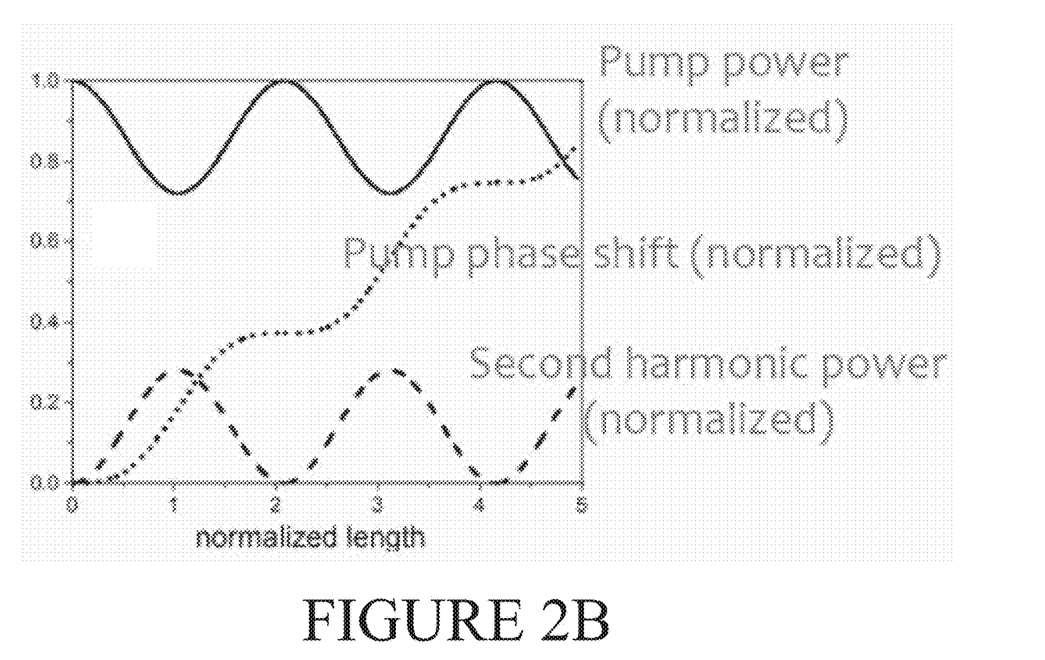
FIG. 2B illustrates phase shifting in a TWPA in accordance with at least some embodiments of the present invention.

FIG. 2B illustrates phase shifting in a TWPA in accordance with at least some embodiments of the present invention. When the wave vectors k_pump=k_signal+k_idler, the situation is optimal. In case energy is transferred from the pump frequency to the second harmonic, the pump is weakened. However, where energy is transferred from the second harmonic back to the pump frequency, the problem of energy bleed from pump to second harmonic is solved. The pump phase shift arises in connection with the transfer of energy from the second harmonic back to the pump. The phase shift is therefore a good sign. In some embodiments, this pump phase shift cancels a TWPA phase mismatch caused by low-frequency dispersion.

Figure 3A:
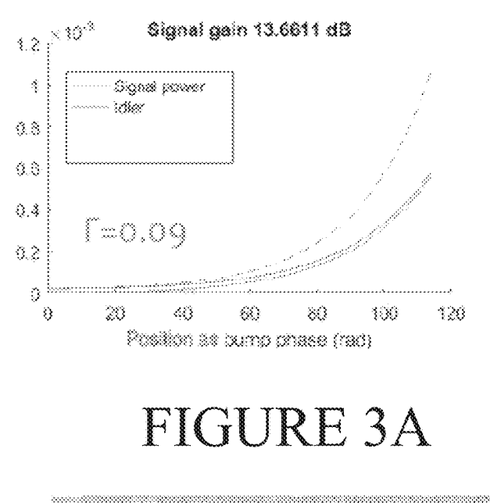
FIG. 3A illustrates three-wave mixing simulated gain in accordance with at least some embodiments of the present invention.

FIG. 3A illustrates three-wave mixing simulated gain in accordance with at least some embodiments of the present invention. Signal and idler powers are shown in dimensionless units. In these simulations, a 10 GHz pump frequency is used, with $\Delta k_{TWPA}/k_p \approx 0.019$ and $\Delta k_{SHG}/k_p \approx 0.24$. As f_p=f_s+f_i always, an optimum is where k_p=k_s+k_i. $\Delta k_{TWPA}$=k_p−k_s−k_i, which is nonzero, and $\Delta k_{SHG}$=k_2p−2k_p. In the figure, Γ=0.09 indicates pump strength, defined as I_p/I_c times a factor which is dependent on the magnetic flux. The dashed line is a theoretical upper bound of the signal power.

Figure 3B:
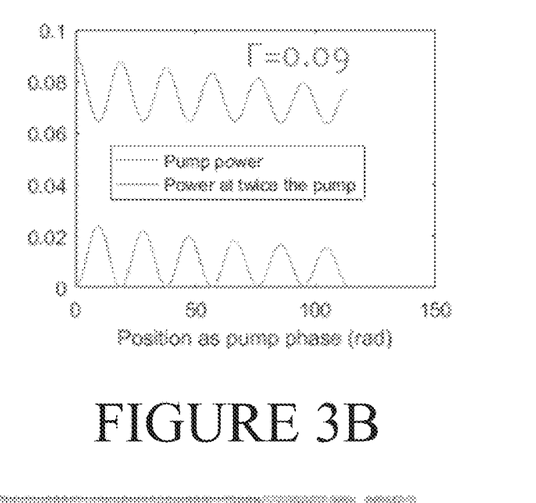
FIG. 3B illustrates pump and second harmonic powers in accordance with at least some embodiments of the present invention.

FIG. 3B illustrates pump and second harmonic powers in dimensionless units in accordance with at least some embodiments of the present invention. Amplitude losses visible in the figure are incurred from the dielectric materials and the resistors, which are discussed herein above.

Figure 3C:
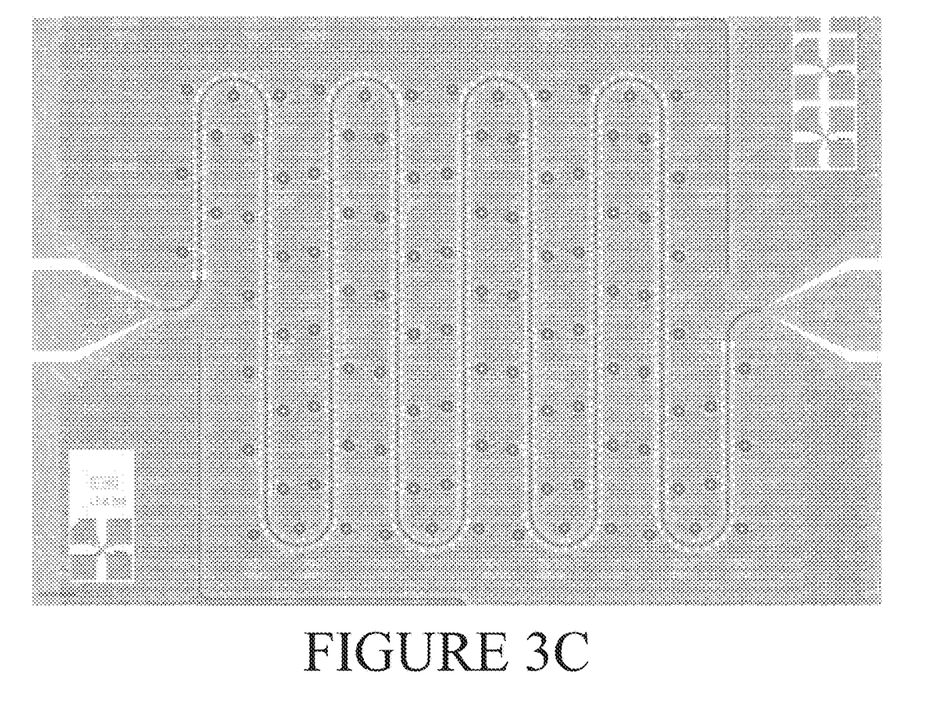
FIG. 3C illustrates an example TWPA in accordance with at least some embodiments of the present invention.

FIG. 3C illustrates the top view of an example TWPA in accordance with at least some embodiments of the present invention. The illustrated TWPA is manufactured on a chip. The example TWPA illustrated in the figure is 9-periodic in the sense that it has 8 unit cells with two Josephson elements in each cell, followed by one cell with a dispersive capacitor instead of any Josephson elements, repeated over and over along the length of the transmission line. 24 cells are in bends and 93 in the long, straight sections resulting in 24+93=117 cells, which is divisible by 9. The spiral-shaped distributed transmission lines of the dispersive capacitors are visible as dark circles in the Figure, disposed on either side along the length of the overall transmission line.

Figure 4:
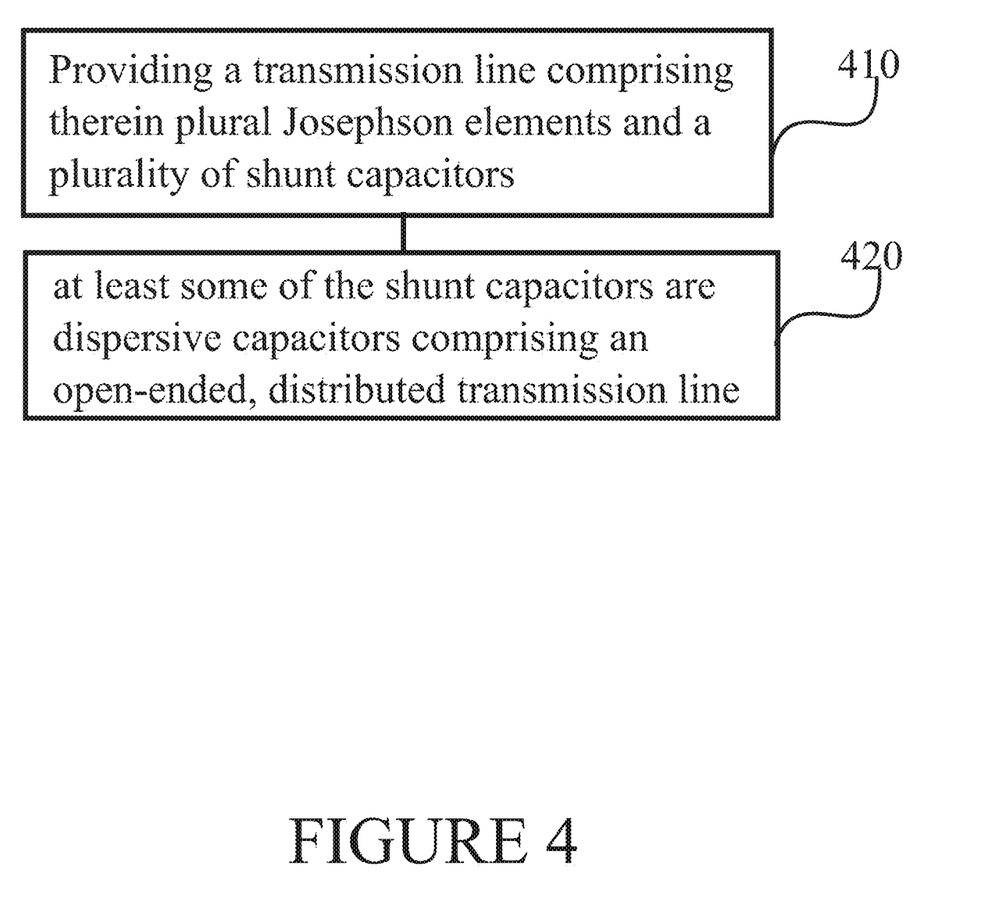
FIG. 4 is a flow graph of a method in accordance with at least some embodiments of the present invention.

FIG. 4 is a flow graph of a method in accordance with at least some embodiments of the present invention. The phases of the illustrated method may be performed in a factory apparatus, an auxiliary device or a personal computer, for example, or in a control device configured to control the functioning thereof, when installed therein.

Phase 410 comprises providing a transmission line comprising therein a plurality of Josephson elements and a plurality of shunt capacitors Phase 420 specifies, that at least some of the shunt capacitors are dispersive capacitors comprising an open-ended, distributed transmission line. For example, the open-ended, distributed transmission line may be arranged in a spiral shape or a polygonal shape. In some embodiments there is further provided a flux bias line configured to generate a magnetic flux threading each of loops of the Josephson elements by meandering alternatingly, repeatedly on either side of the transmission line, which is a coplanar waveguide transmission line, such that the flux bias line crosses over the coplanar waveguide transmission line where a shunt capacitor is disposed on the coplanar waveguide transmission line.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in amplification of low-amplitude signals.

Acronyms List

3WM three wave mixing
4WM four wave mixing
CME coupled mode equation
fI Idler frequency
fP Oscillator/pump frequency
fS Signal frequency
Ic Critical current of Josephson junction
Ip Pump current amplitude
JTWPA Josephson traveling wave parametric amplifier
SHG second harmonic generation
SQUID superconducting quantum interference device
SNAIL superconducting nonlinear asymmetric inductive element
TWPA traveling wave parametric amplifier

REFERENCE SIGNS LIST

| 110 | Josephson element |
| 120 | Shunt capacitor (parallel-plate capacitor) |
| 130 | Flux bias line |
| 140 | Capacitor |
| 150 | Resistor |
| 101 | Wiring layer element |
| 301 | Superconducting part |
| 302 | Tunnel Junction |
| 410-420 | Phases of the method of FIG. 4 |

The invention claimed is:

1. A traveling wave parametric amplifier comprising:
a coplanar waveguide transmission line comprising therein a plurality of Josephson elements and a plurality of shunt capacitors, and wherein
at least some of the shunt capacitors are dispersive capacitors comprising distributed transmission line, and
the distributed transmission lines lack a galvanic connection to a ground of the traveling wave parametric amplifier, and
the traveling wave parametric amplifier is configured with imperfect phase matching of pump tone harmonic generation, wherein energy is transferred from the pump tone to a harmonic of the pump tone, and from the harmonic of the pump tone back to the pump tone, wherein each one of the plural Josephson elements comprises a loop, with at least one Josephson junction of a first size arranged in one side of the loop, wherein a flux bias line is configured to generate a magnetic flux threading each of loops of the Josephson elements by meandering alternatingly, repeatedly on either side of the coplanar waveguide transmission line such that the flux bias line crosses over the coplanar waveguide transmission line where a shunt capacitor is disposed on the coplanar waveguide transmission line.

2. The traveling wave parametric amplifier according to claim 1, wherein conductors of the distributed transmission line of the dispersive capacitors are each arranged in a spiral arrangement.

3. The traveling wave parametric amplifier according to claim 2, wherein the spiral arrangement is a doubly wound spiral arrangement.

4. The traveling wave parametric amplifier according to claim 1, wherein all of the shunt capacitors are dispersive capacitors.

5. The traveling wave parametric amplifier according to claim 1, wherein fewer than all of the shunt capacitors are dispersive capacitors.

6. The traveling wave parametric amplifier according to claim 5, wherein only every nth shunt capacitor is a dispersive capacitor, with n selected from the group {2, 3, 4, 5, 6, 7, 8, 9, 10, 11}.

7. The traveling wave parametric amplifier according to claim 1, wherein the transmission lines of the dispersive capacitors each comprise a planar structure made from a superconducting thin film on a low-loss substrate.

8. The traveling wave parametric amplifier according to claim 7, wherein the low-loss substrate comprises high-resistivity silicon.

9. The traveling wave parametric amplifier according to claim 1, wherein the transmission line comprises more than fifteen of the Josephson elements.

10. The traveling wave parametric amplifier according to claim 1, wherein in
the traveling wave parametric amplifier, a phase change incurred by a signal propagating through the traveling wave parametric amplifier is a linear function of frequency below a frequency of the pump tone and behaves superlinearly above the frequency of the pump tone.

11. The traveling wave parametric amplifier according to claim 1, wherein the flux bias line connects to ground planes of the coplanar waveguide transmission line through resistors.

12. The traveling wave parametric amplifier according to claim 1, wherein each loop further comprises at least one Josephson junction of a second size arranged in another side of the loop.

13. A method for manufacturing a traveling wave parametric amplifier comprising:
   providing a coplanar waveguide transmission line comprising therein a plurality of Josephson elements and a plurality of shunt capacitors, and wherein
   at least some of the shunt capacitors are dispersive capacitors comprising an open-ended, distributed transmission line, and the distributed transmission lines lack a galvanic connection to a ground of the traveling wave parametric amplifier, and wherein the method comprises configuring the traveling wave parametric amplifier with imperfect phase matching of pump tone harmonic generation, such that energy is transferred from the pump tone to a harmonic of the pump tone, and from the harmonic of the pump tone back to the pump tone wherein each one of the plural Josephson elements comprises a loop, with at least one Josephson junction of a first size arranged in one side of the loop, wherein a flux bias line is configured to generate a magnetic flux threading each of loops of the Josephson elements by meandering alternatingly, repeatedly on either side of the coplanar waveguide transmission line such that the flux bias line crosses over the coplanar waveguide transmission line where a shunt capacitor is disposed on the coplanar waveguide transmission line.

* * * * *